United States Patent
Grosjean

(10) Patent No.: US 7,544,531 B1
(45) Date of Patent: Jun. 9, 2009

(54) GROUND STRAP FOR SUPPRESSING STICTION DURING MEMS FABRICATION

(75) Inventor: Charles Grosjean, San Jose, CA (US)

(73) Assignee: SiTime Inc., Sunnyvale, CA (US)

( * ) Notice: Subject to any disclaimer, the term of this patent is extended or adjusted under 35 U.S.C. 154(b) by 193 days.

(21) Appl. No.: 11/770,509

(22) Filed: Jun. 28, 2007

Related U.S. Application Data

(60) Provisional application No. 60/894,604, filed on Mar. 13, 2007.

(51) Int. Cl.
    *H01L 21/00*    (2006.01)
    *H01L 21/461*   (2006.01)
    *H01L 21/302*   (2006.01)

(52) U.S. Cl. .............................. 438/50; 438/51; 438/48; 438/53; 438/706; 438/739

(58) Field of Classification Search ................... 438/48, 438/50–53, 706, 739
See application file for complete search history.

(56) References Cited

U.S. PATENT DOCUMENTS

| | | | |
|---|---|---|---|
| 6,136,630 A | 10/2000 | Weigold et al. | |
| 6,374,677 B1 | 4/2002 | Berlin et al. | |
| 6,429,458 B1 | 8/2002 | Weigold et al. | |
| 6,717,488 B2 | 4/2004 | Potter | |
| 6,777,263 B1* | 8/2004 | Gan et al. | 438/106 |
| 7,115,436 B2* | 10/2006 | Lutz et al. | 438/48 |
| 7,449,355 B2* | 11/2008 | Lutz et al. | 438/50 |
| 2006/0207087 A1 | 9/2006 | Jafri et al. | |
| 2006/0214746 A1 | 9/2006 | Nakamura | |

\* cited by examiner

*Primary Examiner*—Luan C Thai
(74) *Attorney, Agent, or Firm*—Patterson & Sheridan LLP

(57) ABSTRACT

To suppress stiction of a MEMS resonator during fabrication, conductive structures of the MEMS resonator are electrically coupled via a ground strap during the step of forming isolation trenches around their contact structures. After the isolation trenches have been formed, the ground strap is transformed into a non-conductive material to complete the electrical isolation of the conductive structures. An etch mask formed on top of the ground strap prevents etching of the ground strap during the formation of the trenches. Depending on the etching process, the ground strap may be formed as a bridge that suspends above the isolation trench or as a column that extends down to the bottom of the isolation trench.

23 Claims, 12 Drawing Sheets

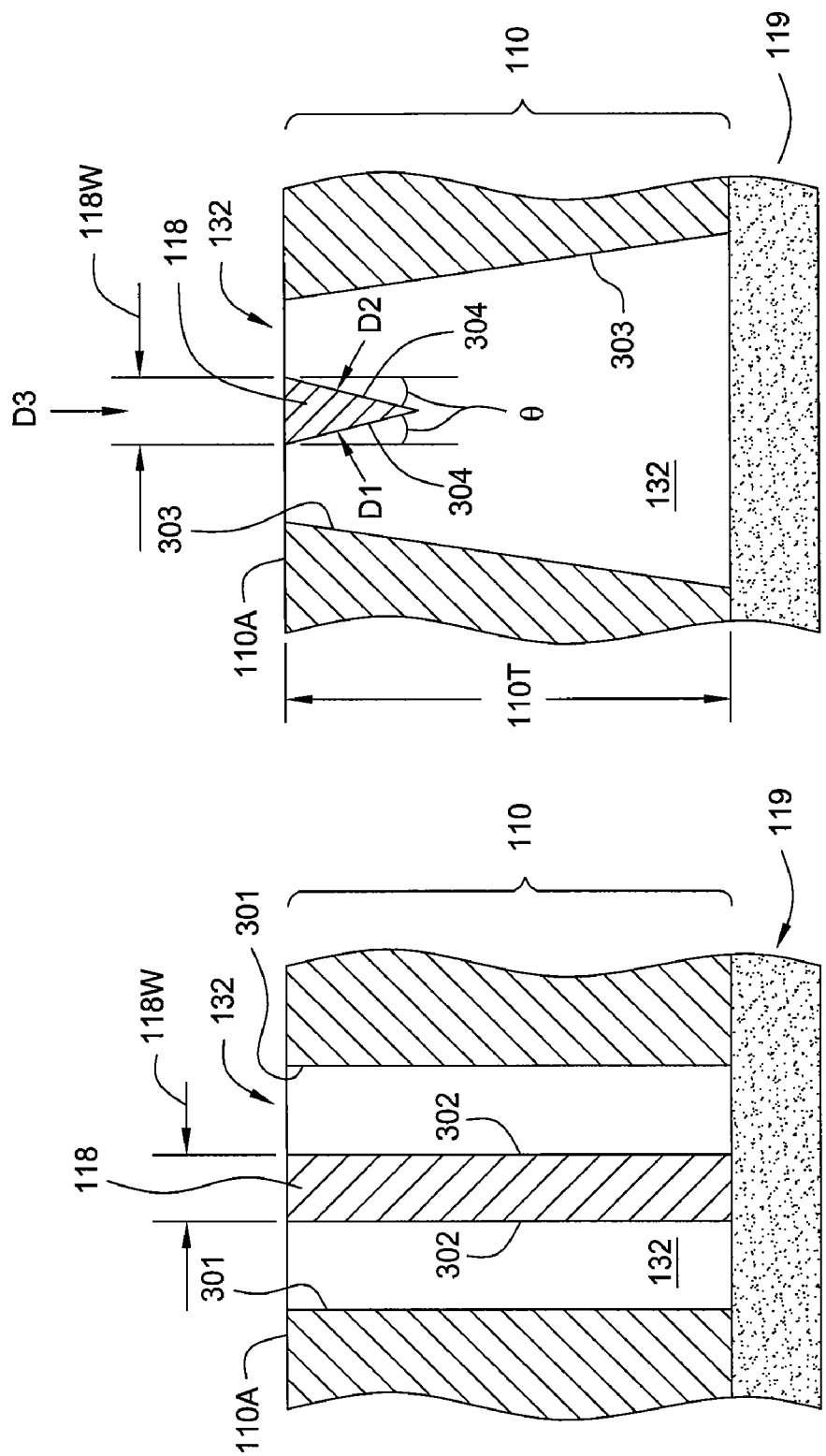

GROUND STRAP FOR SUPPRESSING STICTION DURING MEMS FABRICATION

CROSS-REFERENCE TO RELATED APPLICATIONS

This application relates to, and claims the priority benefit of, U.S. Provisional Patent Application No. 60/894,604, titled "Ground Strap for Suppressing Stiction During MEMS Fabrication," filed on Mar. 13, 2007. The subject matter of the related application is herein incorporated by reference.

BACKGROUND OF THE INVENTION

1. Field of the Invention

Embodiments of the present invention relate generally to the fabrication of microelectromechanical systems (MEMS) and nanoelectromechanical systems (NEMS), and particularly to the suppression of stiction during MEMS and NEMS fabrication.

2. Description of the Related Art

MEMS components are found in numerous applications, including inkjet printers, cell-phone microphones, digital projectors, pressure sensors, and accelerometers. MEMS, also referred to as Micro Systems Technology (MST), include devices ranging in size from the micrometer to the millimeter scale. NEMS devices are similar to MEMS, but significantly smaller in size—from the sub-micrometer scale down to the nanometer scale. MEMS and NEMS are distinguished from comparably sized electronic devices, such as integrated circuits, in that MEMS and NEMS include both electrical and mechanical components that are generally manufactured together using micro-machining techniques.

One example of a MEMS device is the digital micro-mirror device integral to digital light processing (DLP) technology. In a digital micro-mirror device, a pair of electrodes control the position of a micro-manufactured mirror mounted on a torsion hinge. Another example is a MEMS resonator, in which one or more mechanical beams are deflected by an electrostatic charge periodically applied to a drive electrode to induce vibration at a resonant frequency.

Due to their large surface to volume ratio, the behavior of MEMS devices is dominated by surface effects compared to volume effects. Surface effects include electrostatic, van der Waals, and capillary forces. Examples of volume effects include inertia and beam bending. Because of this, stiction of the microelectromechanical components of a MEMS device often occurs when these components come into contact with another surface. As used herein, "stiction" for a microelectromechanical structure is defined as the state of being stuck or frozen in a non at-rest position. For a MEMS resonator, some types of stiction are also referred to as "snap-down." Stiction occurs whenever the restoring force of the microelectromechanical component is less than the stiction force produced by the unwanted contact with another surface. Such unwanted contact may be initiated by the high accelerations associated with mechanical shock of a MEMS device, liquid or other contamination either inside a MEMS device or on surfaces of a MEMS device, or deflection of a MEMS device's moving parts due to electrostatic charges accumulated on structures in the MEMS device.

Some MEMS devices, such as MEMS resonators, are manufactured with the same silicon fabrication technology used for producing microelectronics. In some cases, MEMS devices so produced are susceptible to experiencing stiction caused by accumulated static charges. This is because the requisite silicon fabrication technologies include methods, such as reactive ion etch, that may highly charge regions on the surface of a substrate during processing.

SUMMARY OF THE INVENTION

The present invention provides methods to suppress stiction of a MEMS resonator during fabrication by electrically coupling conductive structures of the MEMS resonator via a ground strap during the step of forming isolation trenches around their conductive structures. After the trenches have been formed, the ground strap is transformed into a non-conductive material or removed to complete the electrical isolation between the conductive structures. The invention is particularly applicable for fabricating MEMS resonators that have a low restoring force, hereto referred to as lightly sprung, for example, MEMS resonators designed for real-time clock (RTC) applications.

According to one embodiment, a fabrication process for a MEMS device comprises forming a microelectromechanical structure and conductive structures around the microelectromechanical structure, including a conductive layer above the microelectromechanical structure, forming contact structures for the microelectromechanical structure and the conductive structures, forming a trench through the conductive layer around each contact structure while maintaining a conductive path so that the contact structure is electrically coupled to other contact structures through the conductive path and the conductive layer, and transforming the conductive path for each contact structure to be non-conductive to cause the contact structures to be electrically isolated from each other. The conductive path may be transformed to be non-conductive via an oxidation process. The step of forming the trench may comprise forming an etch mask that partially covers a trench region on the conductive layer that is to be etched, and etching the trench region on the conductive layer using the etch mask. The etching may be performed to produce parallel or non-parallel trench sidewalls.

According to another embodiment, a method for fabricating a MEMS device comprises forming first and second conductive structures, one of which is a microelectromechanical structure, and a conductive layer above the first and second conductive structures, forming an etch mask above the conductive layer, the etch mask partially exposing an area above an isolation trench that is to be formed through the conductive layer around a contact structure for one of the first and second conductive structures, etching the isolation trench through the conductive layer using the etch mask so that a conductive path from the contact structure to the conductive layer remains after etching, and removing the conductive path. Removing the conductive path may comprise oxidizing the conductive path, and etching may be performed to produce parallel or non-parallel trench sidewalls.

According to another embodiment, a method of manufacturing a device having an electromechanical structure and an electrode structure comprises forming an insulating layer on top of the electromechanical structure and the electrode structure, forming a conductive layer on top of the insulating layer, etching through the conductive layer using the insulating layer as the etch stop layer to partially form an isolation trench between the electromechanical structure and the electrode structure, and transforming one or more portions of the conductive layer that have not been etched to be non-conductive to complete the formation of the isolation trench. An oxidation process may be used to transform portions of the conductive layer that have not been etched to be non-conductive. Portions of the conductive layer that have not been etched may define one or more bridges that suspend above the partially formed isolation trench, or one or more columns that span across the partially formed isolation trench.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 3B and 3C are partial cross-sectional views of a contact structure shown in FIG. 3A, illustrating a ground strap according to an embodiment of the invention.

For clarity, identical reference numerals have been used, where applicable, to designate identical elements that are common between figures. It is contemplated that features of one embodiment may be incorporated in other embodiments without further recitation.

DETAILED DESCRIPTION

The inventors have discovered that stiction occurs during the fabrication of a MEMS resonator due to a relatively high potential difference developing between a fixed structure contained in the MEMS resonator and a resonating member also contained in the MEMS resonator. The fixed structure may be an electrode structure or other structures proximate the resonating member, such as the conductive layer above the resonating member and the conductive substrate below the resonating member. In either case, this potential difference produces high vertical and/or lateral electric fields, causing exaggerated deflection of the resonating member. The magnitude of these charge imbalances results in a potential difference that may be substantially higher than the design voltage of the MEMS resonator. In the latter event the resulting deflection caused by such charge imbalances may be greater than the intended deflection of the resonating member. Hence, the resonating member may be deflected until contact occurs with other structures within the MEMS device. For some MEMS resonators, the restoring force of the resonating member, when deflected, may be significantly lower than the frictional, van der Waals, surface tension, or other stiction force between the resonating member and the contacted surface. When this is the case, stiction occurs and the resonating member will remain fixed against the electrode or other structure, even after the removal of any potential difference therebetween, thereby rendering the MEMS device permanently inoperable.

Embodiments of the invention contemplate methods for suppressing stiction during the MEMS fabrication process. More specifically, a method is contemplated that electrically couples conductive structures of a MEMS resonator during the step of forming isolation trenches between these structures so that stiction of a microelectromechanical resonator beam due to electrostatic forces can be prevented. The method is generally applicable to any MEMS manufacturing process in which a potential difference may be produced between different conductive structures of a MEMS device, but the invention is particularly applicable to the fabrication of lightly sprung MEMS resonators. Examples of lightly sprung MEMS resonators include the relatively low frequency MEMS resonators useful for real-time clock (RTC) applications, which operate at frequencies of approximately 1 MHz and below. When lightly sprung, the restoring force of the resonating member, also referred to as a resonator beam, may be significantly lower than the stiction force between the resonator beam and any surface contacted by the resonator beam. As used herein, "conductive" is defined as being sufficiently dissipative of electric charge to act as a ground strap or conductor for a static electric charge, i.e., having a resistance of no more that about 1 to 10 megohm.

Figure 1:
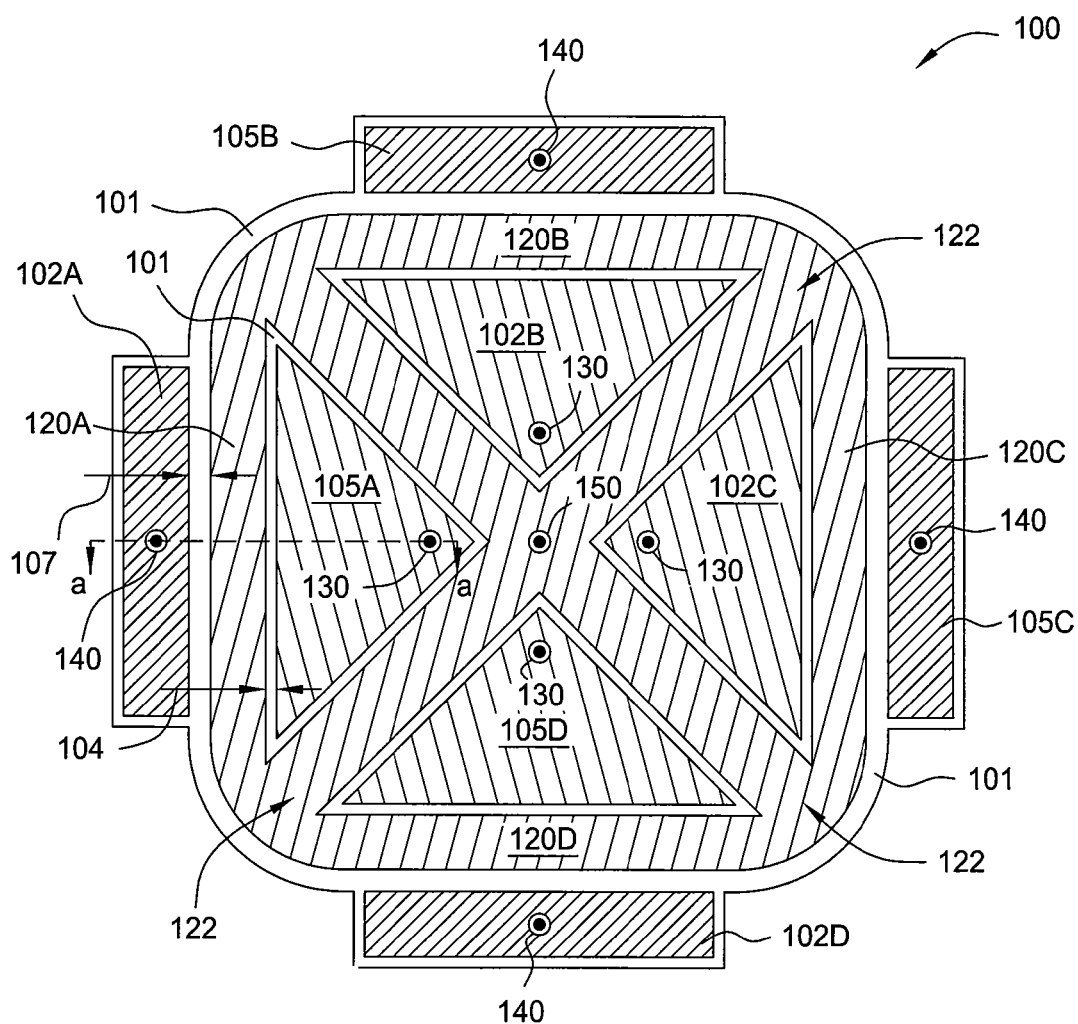
FIG. 1 is a plan view of one type of a MEMS resonator that may benefit from embodiments of the invention.

FIG. 1 is a plan view of one type of a MEMS resonator 100 that may benefit from embodiments of the invention. For clarity, MEMS resonator 100 is illustrated in FIG. 1 without a protective encapsulation layer. In the example shown, MEMS resonator 100 includes a chamber 101 containing four resonator beams 120A-D, four sense electrodes 102A-D, and four drive electrodes 105A-D. Contact structures 130, 140, 150 are positioned to provide a conductive path to drive electrodes 105A-D, sense electrodes 102A-D, and resonator beams 120A-D of MEMS resonator 100, respectively.

In this example, MEMS resonator 100 is configured as a rectangular, four-beam resonator. The four resonator beams, i.e., resonator beams 120A-D, are joined in a square arrangement. The node points 122 of the resonator beams are located at each end of the resonator beams, and the resonator beams are fixed to each other at the node points 122. In another example, MEMS resonator 100 may be a cantilever beam configuration (not shown), in which each beam is attached at one end to a base, the base corresponding to the node point of the beam. Other resonator configurations may also benefit from embodiments of the invention.

Generally, a MEMS resonator includes one or more drive electrodes and sense electrodes. For the MEMS resonator illustrated In FIG. 1, each of resonator beams 120A-D has a drive electrode 105A-D and a sense electrode 102A-D, respectively. In operation, the drive electrode of a resonator is configured to provide the electrostatic driving force to the resonator beam, and the sense electrode is adapted to measure the motion of the excited resonator. The arrangement and distribution of the drive and sense electrodes may vary with resonator design and application, but generally, the gap 104 between drive electrode 105A and resonator beam 120A is minimized to reduce power consumption of the resonator. In addition, the gap 107 between sense electrode 102A and resonator beam 120A is minimized to improve the signal-to-noise ratio of the resonator. For example, gaps 104 and 107 may be as small as about 0.2 to 0.4 µm for an 800 kHz MEMS resonator.

Because gaps 104 and 107 are generally designed to be as narrow as practicable for a given MEMS resonator, even a small potential difference between resonator beam 120A and a proximate surface may result in over-deflection of resonator beam 120A. Examples of proximate surfaces include drive electrode 105A, sense electrode 102A, encapsulation layer 110, and bulk region 115B of substrate 115 (illustrated in FIG. 2B). For lower frequency MEMS resonators, a potential difference of as little as 7 V may cause resonator beam 120A to contact an internal surface of MEMS resonator 100, such as drive electrode 105A, sense electrode 102A, or encapsulation layer 110. Because the restoring force of lower frequency MEMS resonators may be lower than the stiction forces, such contact generally results in resonator beam stiction, permanently disabling the MEMS resonator.

FIGS. 2A-H illustrate partial schematic side views of a MEMS resonator 100 being formed in accordance with embodiments of the invention. The cross-sectional view in FIGS. 2A-H is taken along section a-a, indicated in FIG. 1.

Figure 2A:
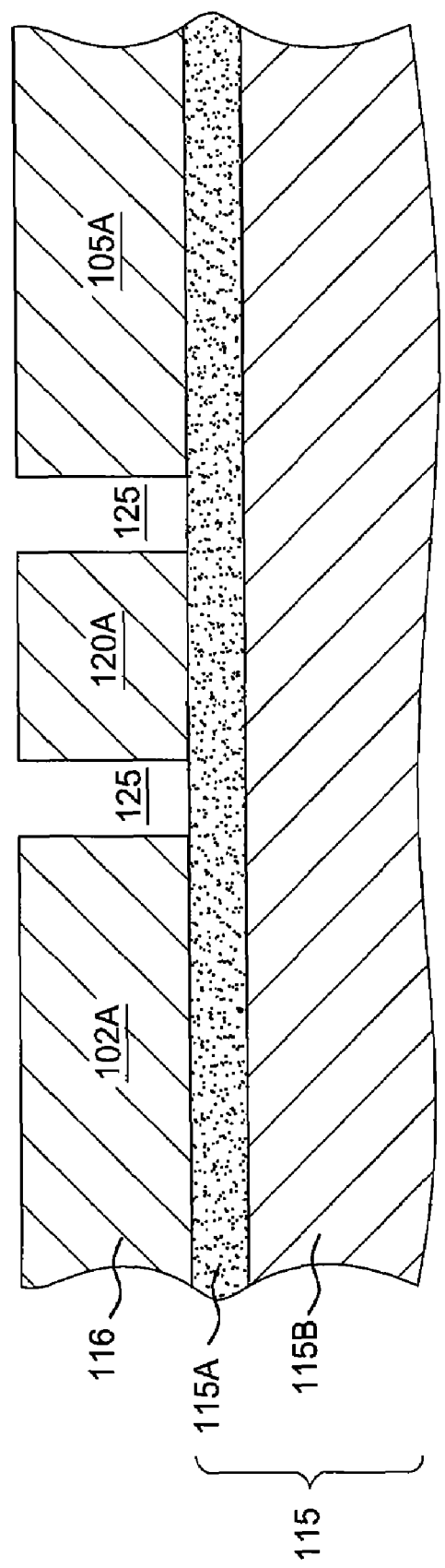
FIGS. 2A-H illustrate partial schematic side views of a MEMS resonator being formed in accordance with embodiments of the invention.

FIG. 2A illustrates a substrate 115 on which MEMS resonator 100 is formed. Substrate 115 is a silicon-based substrate. In one embodiment, substrate 115 has a single-crystal silicon bulk layer 115B with an oxide layer 115A grown on bulk layer 115B. Oxide layer 115A is a conventional silicon dioxide ($SiO_2$) layer and may be formed by methods known in the art. For example, oxide layer 115A may be a thermally grown oxide or a CVD-deposited oxide. Oxide layer 115A may be between about 0.5 μm and about 1 μm thick.

A resonator trench layer 116, which may also be referred to as the device layer, is formed on oxide layer 115A using methods known in the art, for example via wafer bonding. In an alternative embodiment, substrate 115 is a silicon-on-insulator (SOI) wafer and resonator trench layer 116 is also formed therefrom. Resonator trench layer 116 is preferably single-crystal silicon in this embodiment. Sense electrode 102A, drive electrode 105A, and resonator beam 120A are formed from resonator trench layer 116. In one example, resonator trench layer 116 is about 10 μm thick. Trenches 125 are formed into resonator trench layer 116 via lithography and etching methods known in the art. For example, a photo-resist layer (not shown) may be deposited on the top surface of resonator trench layer 116, and an etch mask (not shown) may be formed on resonator trench layer 116 by exposure of the photo-resist layer to a suitable light source via a standard lithographic process. Then a dry etch process, such as an reactive ion etch process, may be performed on resonator trench layer 116, by which material is removed from regions of resonator trench layer 116 not covered by the etch mask, thereby forming trenches 125. The etch mask may then be removed by a standard oxygen ashing process.

Figure 2B:
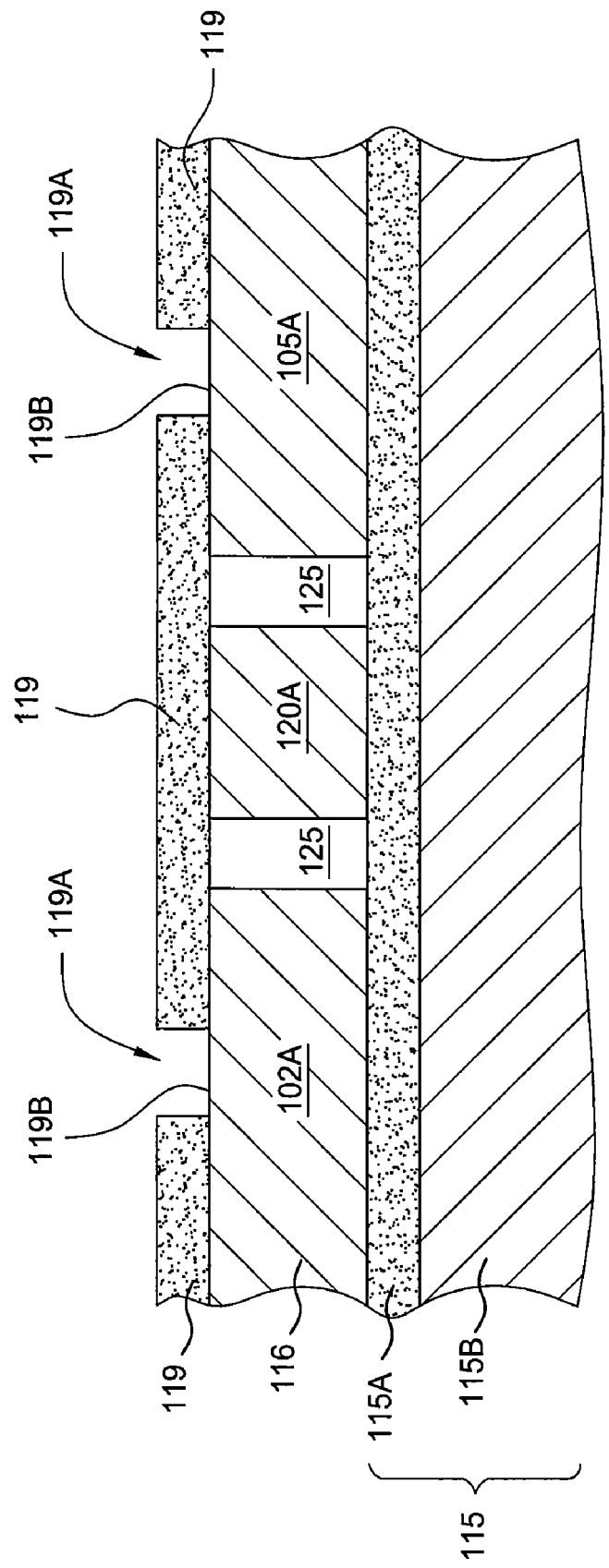

FIG. 2A depicts resonator trench layer 116 after the formation of trenches 125, which partially define sense electrode 102A, drive electrode 105A, and resonator beam 120A. A trench fill oxide layer 119 (shown in FIG. 2B) is then deposited onto resonator trench layer 116. Trench fill oxide layer 119 may be a conventional silicon dioxide ($SiO_2$) layer and may be formed by a PECVD TEOS method, a PECVD silane method, or an LPCVD method, among others. Trench fill oxide layer 119 may range in thickness from about 0.5 μm to 2.0 μm. After deposition, trench fill layer 119 is patterned and etched to form apertures 119A, as illustrated in FIG. 2B. Apertures 119A provide electrically conductive paths through trench fill oxide layer 119 to exposed regions 119B on each component of MEMS resonator 100 that will be electrically coupled to a contact structure.

Figure 2C:
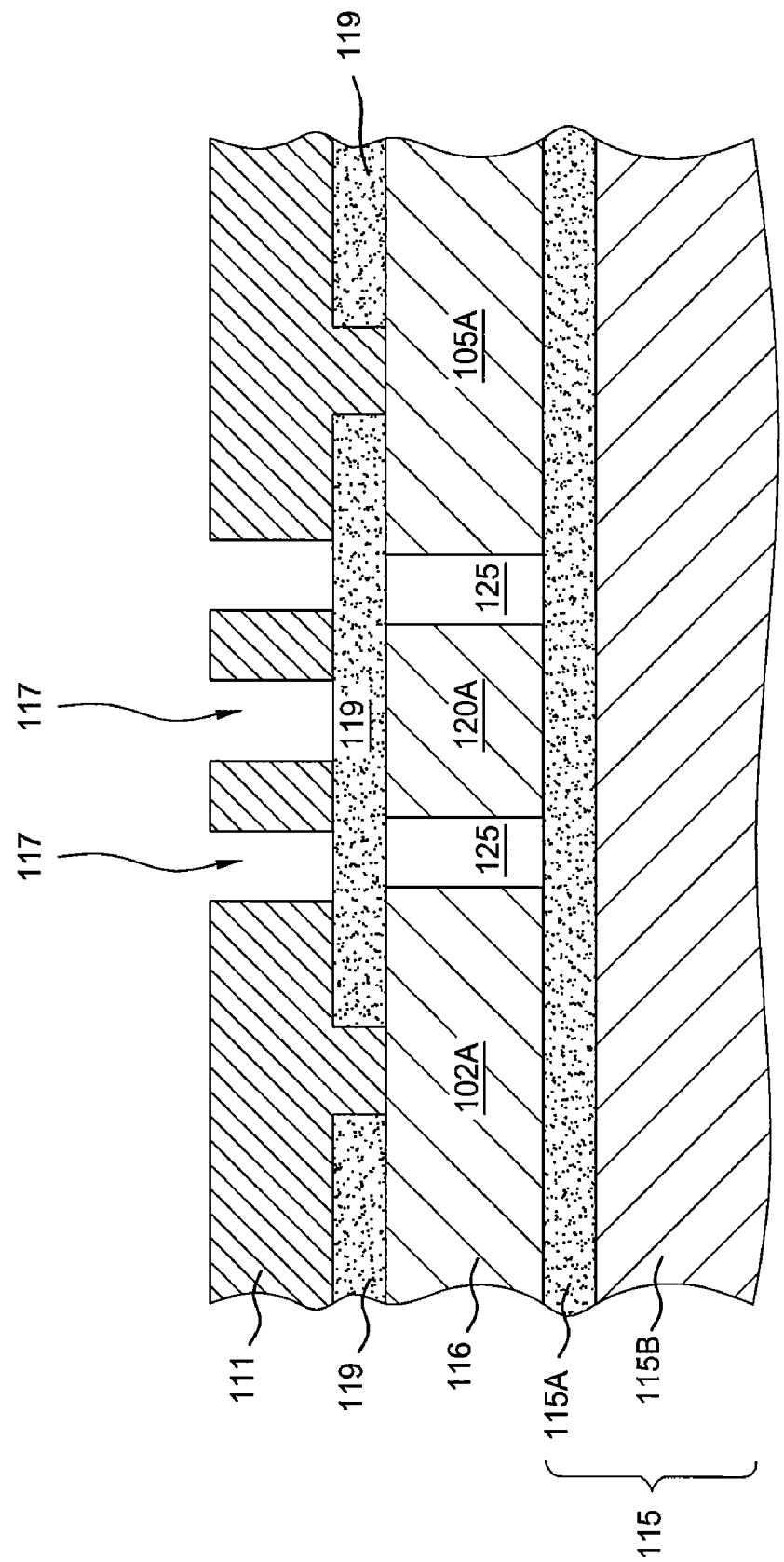

Vent layer 111 is then deposited on trench fill oxide layer 119 and is patterned and etched with vents 117, as illustrated in FIG. 2C. Vents 117 completely penetrate vent layer 111, thereby exposing portions of trench fill oxide layer 119. Vent layer 111 is the first layer of encapsulation layer 110 and acts as the foundation on which the remaining elements of encapsulation layer 110 are formed (see FIG. 2E). In addition, a plurality of vents 117 formed in vent layer 111 allow the formation of chamber 101 around resonator beam 120A using methods described below in conjunction with FIG. 2D. Vent layer 111 is made of an electrically conductive material that is substantially unaffected by the process used to form chamber 101, i.e., the material should be essentially inert with respect to the chemistries used in the chamber formation process. In addition, the material of vent layer 111 should be able to withstand the high temperatures that occur during subsequent steps in the fabrication of MEMS resonator 100, such as the formation of the remaining layers of encapsulation layer 110. In one example, vent layer 111 is a silicon-based material, such as polysilicon. For structural soundness, vent layer 111 should be from about 1 μm to 4 μm in thickness, or more. In some configurations, vent layer 111 may be thinner than 1 μm, but this increases the risk of chamber 101 collapsing during the fabrication of MEMS resonator 101.

Figure 2D:
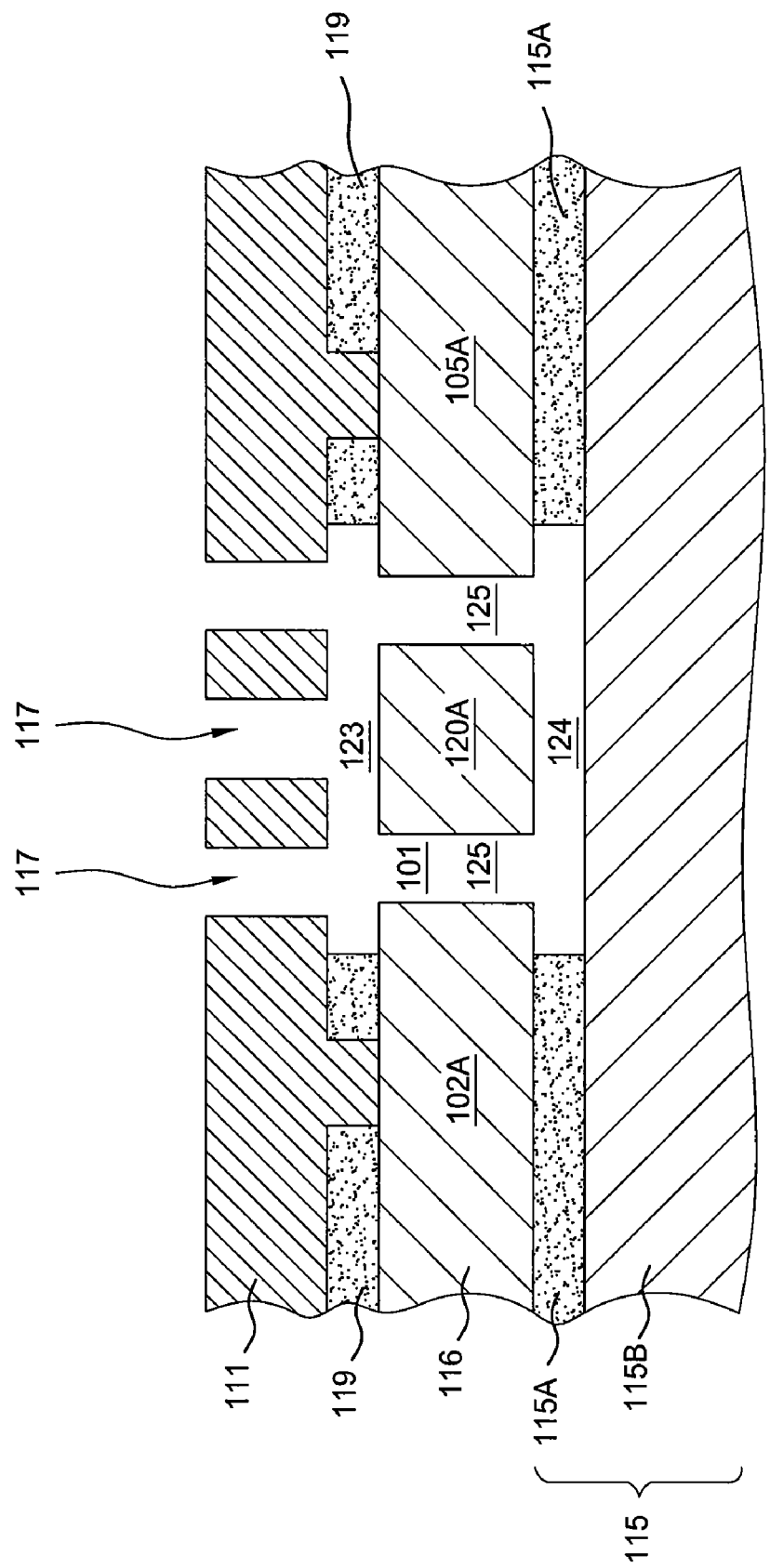

After vents 117 are formed in vent layer 111, an HF release process is performed, as a result of which chamber 101 is formed to define resonator beam 120A, sense electrode 102A and drive electrode 105A, as illustrated in FIG. 2D. During the HF release process, the microelectromechanical structure of a MEMS device is released by the removal of portions of trench fill oxide layer 119 and oxide layer 115A, which are silicon dioxide layers and are selectively etched by hydrofluoric acid (HF) over polysilicon and monocrystalline silicon. In the example shown, the microelectromechanical structure released is resonator beam 120A. The HF release process may involve the use of an HF-containing gas, which forms upper cavity 123 and lower cavity 124, via vents 117 and trenches 125. Together, upper cavity 123, lower cavity 124, and trenches 125 make up chamber 101. An HF-containing gas is used instead of a wet-etching method because liquids are extremely difficult to remove completely from such a small cavity, and the presence of liquids in chamber 101 is undesirable for the operation of MEMS resonator 101. A liquid-based process can also cause stiction in and of itself. Upon completion of the HF release process, resonator beam 120A is no longer encased in trench fill oxide layer 119 and oxide layer 115A, and therefore may experience stiction if deflected too far.

Figure 2E:
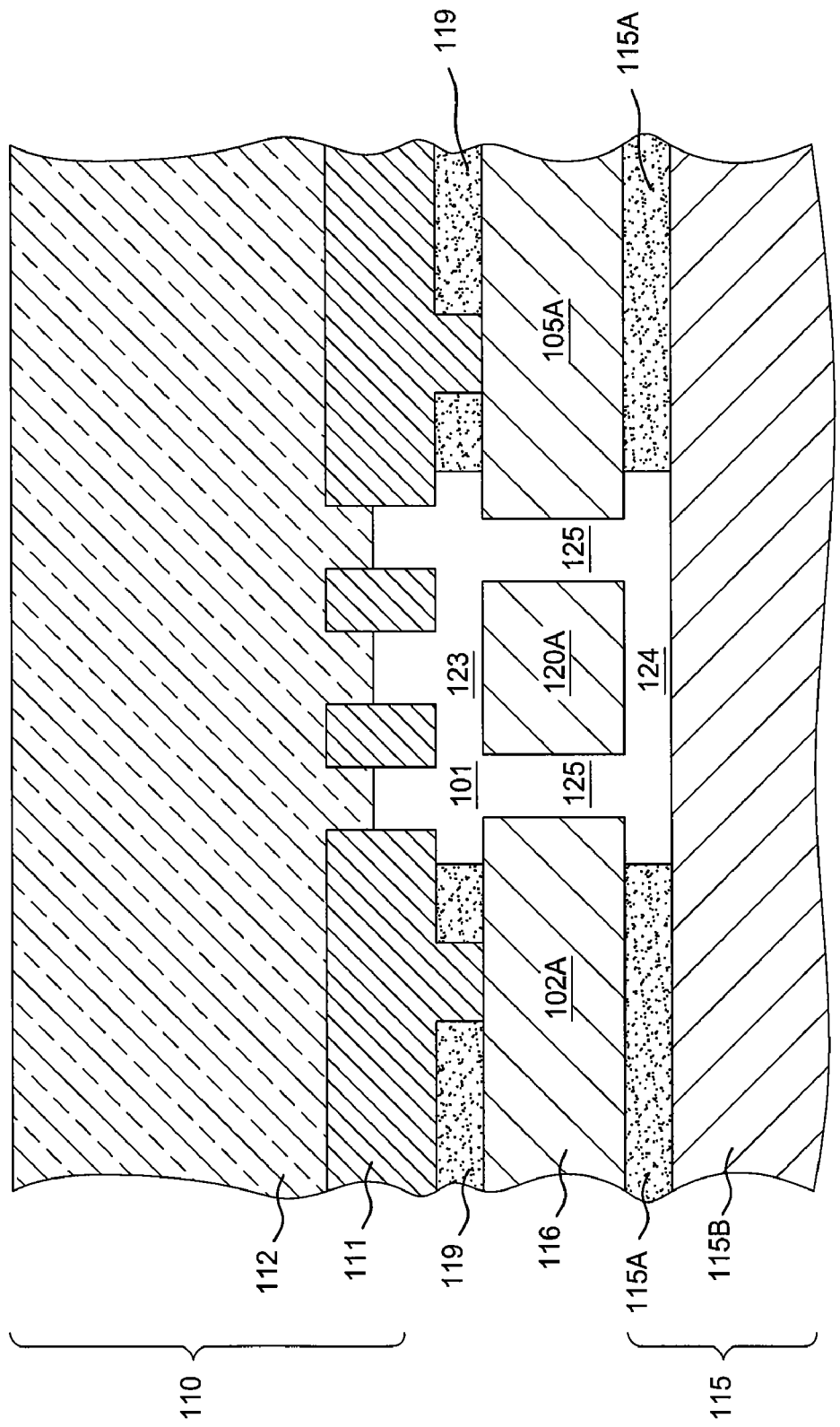

Seal layer 112 is then deposited onto vent layer 111, sealing vents 117 and chamber 101, as illustrated in FIG. 2E. Seal layer 112 may be formed by epitaxial silicon deposition methods commonly known in the art. Seal layer 112 is intended to seal vents 117 in vent layer 111 after the formation of chamber 101. In this embodiment, seal layer 112 also forms a mechanically robust membrane that can withstand the stresses of fabrication, manufacturing, and packaging. Seal layer 112 may be between about 0.5 μm to 20 μm in thickness, depending on the geometry of vents 117 to be filled, the material properties of seal layer 112, and other factors. In one example, seal layer 112 is a polysilicon layer.

Figure 2F:
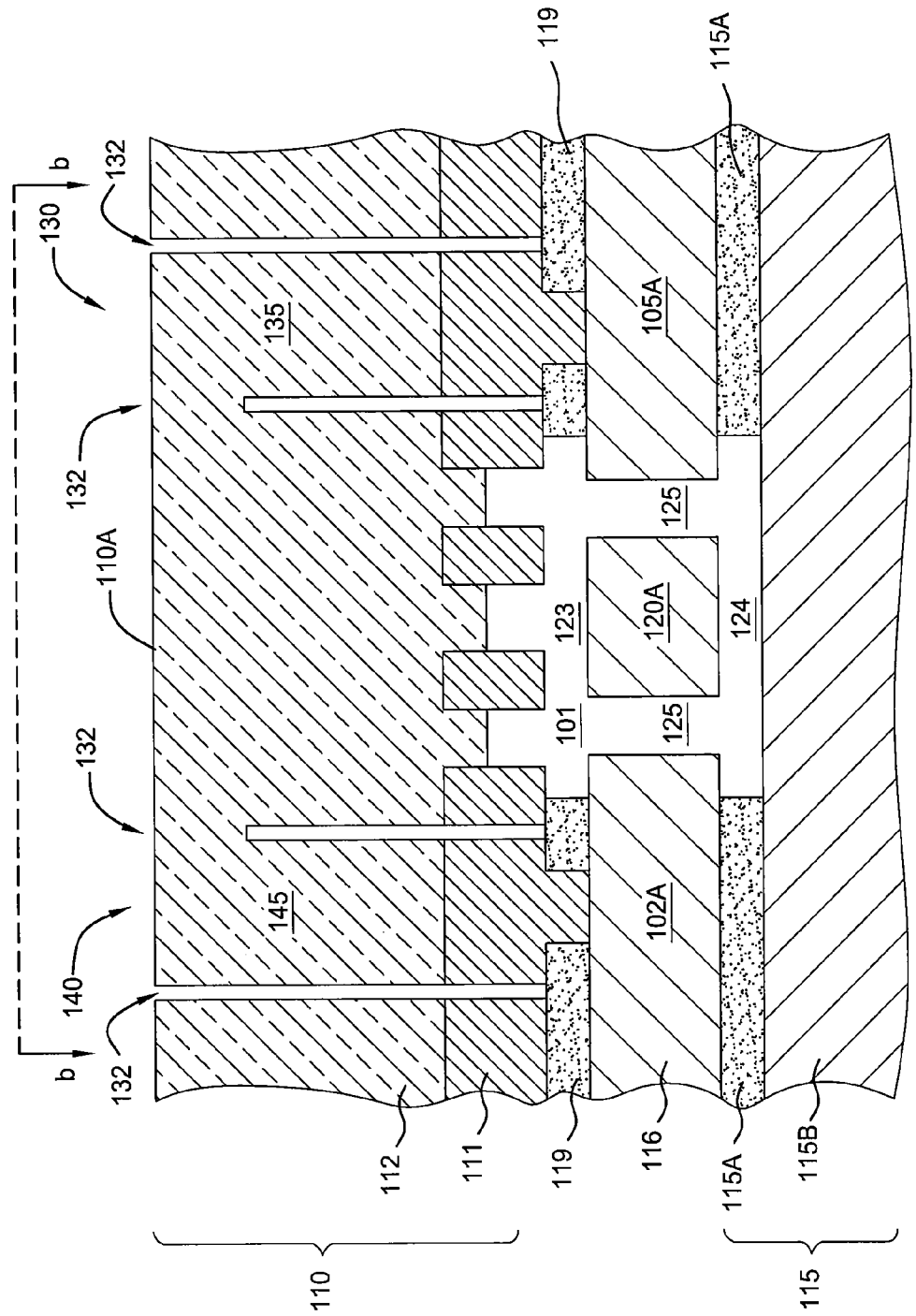
Figure 3A:
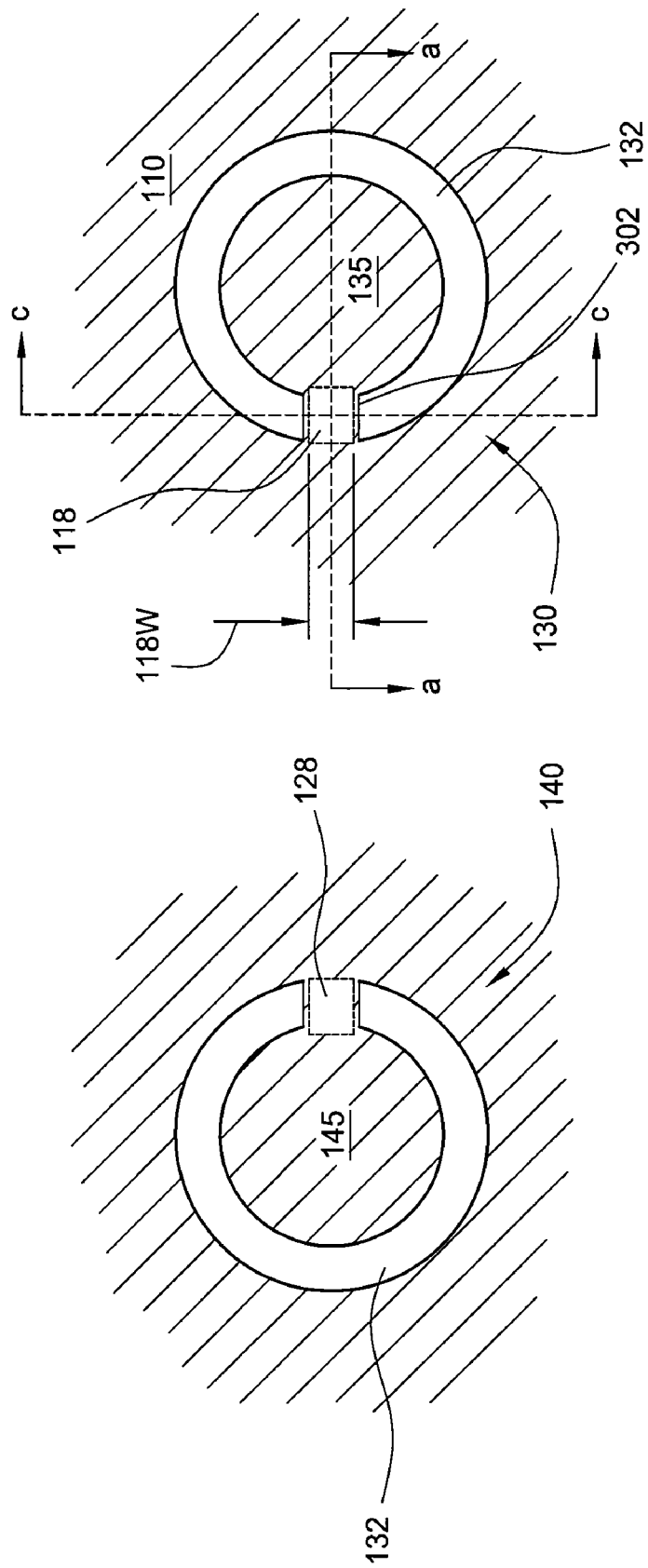
FIG. 3A is a top plan view of a MEMS resonator shown in FIG. 2F, illustrating a ground strap according to an embodiment of the invention.

Isolation trenches 132 are cut into encapsulation layer 110 to substantially define bulk contact regions 135, 145 of contact structures 130, 140, respectively, as illustrated in FIG. 2F. The top plan view of contact structures 130, 140 is illustrated in FIG. 3A. In the example illustrated in FIG. 2F, bulk contact regions 135, 145 are substantially cylindrical regions, although bulk contact regions 135, 145 are not limited to this geometry. Also, isolation trenches 132 do not completely separate bulk contact region 135, 145 from the surrounding regions of encapsulation layer 110. As illustrated in FIG. 3A, a ground strap 118, which consists of material from encapsulation layer 110, electrically couples bulk contact region 135 with the surrounding regions of encapsulation layer 110 during subsequent process steps. Bulk contact region 135 provides a conductive path to and from drive electrode 105A, and, except for ground strap 118, is electrically isolated from other regions of encapsulation layer 110 by isolation trench 132. Similarly, a ground strap 128, which consists of material from encapsulation layer 110, electrically couples bulk contact region 145 with the surrounding regions of encapsulation layer 110 during subsequent process steps. Bulk contact region 145 provides a conductive path to and from sense electrode 102A, and, except for ground strap 128, is electrically isolated from other regions of encapsulation layer 110 by isolation trench 132.

Patterning and masking methods commonly known in the art may be used to mask regions of encapsulation layer 110 that do not require material removal, such as bulk contact regions 135, 145 and ground straps 118, 128. Isolation trenches 132 are then cut into the unmasked regions of encapsulation layer 110. Isolation trenches 132 terminate, or "land," on a silicon dioxide ($SiO_2$) layer, i.e., trench fill oxide layer 119. All other contact structures of MEMS resonator 100 are also formed at the same time and in a similar manner. Isolation trenches 132 are etched with substantially vertical walls using a deep reactive ion etch (DRIE) method. DRIE is a subclass of reactive ion etch (RIE) known in the art that allows the vertical etching of features with aspect ratios of up to 50:1. The chemistry of a DRIE process may be chosen to selectively etch polysilicon over silicon dioxide ($SiO_2$). Therefore, the DRIE process may etch very deep and/or high-aspect ratio features into polysilicon, but will essentially stop removing material once an oxide layer, also referred to as a "stop oxide," is encountered. Hence, in the case of contact structure 130, isolation trenches 132 may be formed through encapsulation layer 110 without the risk of etching through the underlying layer, i.e., trench fill oxide layer 119, because the etch rate of the DRIE process is greatly reduced through silicon dioxide ($SiO_2$). This difference in etch rate between silicon dioxide ($SiO_2$) and polysilicon allows the formation of very deep features that consistently have uniform depth.

Another feature of DRIE is the ability to control the sidewall angle of a feature etched into a material. For example, when DRIE is used to etch downward from the top surface of a substrate, the etched feature may be formed with walls that are less than, greater than, or parallel to vertical. This feature may be used to produce different configurations of ground strap 118.

FIG. 3B is a partial cross-sectional view of contact structure 130 taken from section line c-c, as indicated in FIG. 3A, illustrating ground strap 118 according to one embodiment of the invention. In this embodiment, ground strap 118 is formed by a DRIE process tuned to produce vertical trench sidewalls 301 and vertical ground strap sidewalls 302 that define isolation trench 132. Ground strap 118 is a rectangular column disposed between and in contact with bulk contact region 135 and the surrounding region of encapsulation layer 110 (see FIG. 3A). Ground strap 118 has vertical ground strap sidewalls 302 and extends from surface 110A of encapsulation layer 110 to trench fill oxide 119. Hence, vertical ground strap sidewalls 302 are substantially normal to surface 110A and parallel to the direction of etching, i.e., vertical. In this embodiment, the width 118W of ground strap 118 should be no greater than about 1000 to 2000 Å to ensure complete oxidation of ground strap 118 during a subsequent process step. If width 118W is substantially greater than about 2000 Å, a central region may remain unoxidized after the formation of MEMS resonator 100 is complete. If the central region of ground strap 118 is not completely oxidized prior to the completion of MEMS resonator 100, the desired electrical isolation between conductive structures of the completed MEMS resonator 100 cannot be achieved. Ground strap 128 is formed in the same manner as ground strap 118 described above.

FIG. 3C is a partial cross-sectional view of contact structure 130 taken from section line c-c, as indicated in FIG. 3A, illustrating ground strap 118 according to another embodiment of the invention. In this embodiment, ground strap 118 is formed by a DRIE process tuned to produce isolation trench sidewalls 303 and ground strap sidewalls 304 that are not substantially parallel to vertical. Instead, trench sidewalls 303 and ground strap sidewalls 304 are at an angle θ from the direction of etching. In the example described herein, the angle of etching is vertically downward from the surface 110A of encapsulation layer 110 to trench fill oxide layer 119. Because ground strap sidewalls 134 are formed at angle θ from the direction of etching, ground strap 118 does not extend to trench fill oxide layer 119 and instead forms a bridge between bulk contact region 135 and surrounding regions of encapsulation layer 110. A suitable value for angle θ is a function of a number of factors, including the thickness 110T of encapsulation layer 110, the width 118W of ground strap 118, and the duration of the oxidizing process, among others. Angle θ may be selected by one skilled in the art for a particular configuration of contact structure 130. In this embodiment, width 118W of ground strap 118 may be up to 2000 to 3000 Å, since oxygen may diffuse into ground strap 118 from three directions, i.e., D1, D2, and D3, during subsequent oxidation of ground strap 118. Ground strap 128 is formed in the same manner as ground strap 118 described above.

Because RIE and DRIE involve the ionic bombardment of a substrate surface as part of the etching process, a charge build-up may occur on the substrate. As long as all regions of the substrate surface are electrically coupled, no potential difference can develop between these regions. As noted above, encapsulation layer 110 is a conductive material and electrically couples conductive structures of MEMS resonator 100 prior to the formation of isolation trenches 132. During the formation of isolation trenches 132, however, encapsulation layer 110 alone cannot provide this protection.

Without ground straps 118, 128, contact structures 130, 140 will be electrically isolated from other conductive structures of MEMS resonator 100 during the final portion of the DRIE process, as each contact structure lands on its respective stop oxide at a different time. This is not desirable because only a few seconds are required for a significantly higher charge to build up on an electrically isolated contact and cause stiction. With the process according to the present invention, ground straps 118, 128 are not etched during the DRIE process. Therefore, for the entire DRIE process, bulk contact region 135 and drive electrode 105A are electrically coupled to all other conductive structures of MEMS resonator 100 via ground strap 118, and bulk contact region 145 and sense electrode 102A are electrically coupled to all other conductive structures of MEMS resonator 100 via ground strap 128.

A conductive path is also provided between resonator beam 120A and the roof/floor of cavity 101 via a ground strap that is formed when an isolation trench for contact structure 150 (see FIG. 1) for the resonator beam 120A is etched. The conductive path from resonator beam 120A to the floor of cavity 101 exists, because resonator beam 120A and the roof of cavity 101 are electrically connected through this ground strap, and the roof of cavity 101 and the floor of cavity 101 are electrically connected around the edges of the wafer on which MEMS resonator 100 is fabricated. The conductive path between resonator beam 120A and the roof/floor of cavity 101 alleviates stiction that may have been caused by a vertical charge buildup—i.e., a charge differential between resonator beam 120A and roof/floor of cavity 101.

Returning to FIG. 2F, after isolation trenches 132 are formed, etch mask material (not shown) is then removed from the surface of encapsulation layer 110 using methods commonly used in the art. In one example, etch mask material is removed using an oxygen asher. An oxygen asher uses oxygen plasma to chemically remove photoresist and other organic compounds isotropically from the surface of substrates. Because the oxygen ashing process may also result in charge build-up on electrically isolated structures on a substrate, stiction may occur in MEMS devices during this process without the presence of ground straps 118, 128.

Figure 2G:
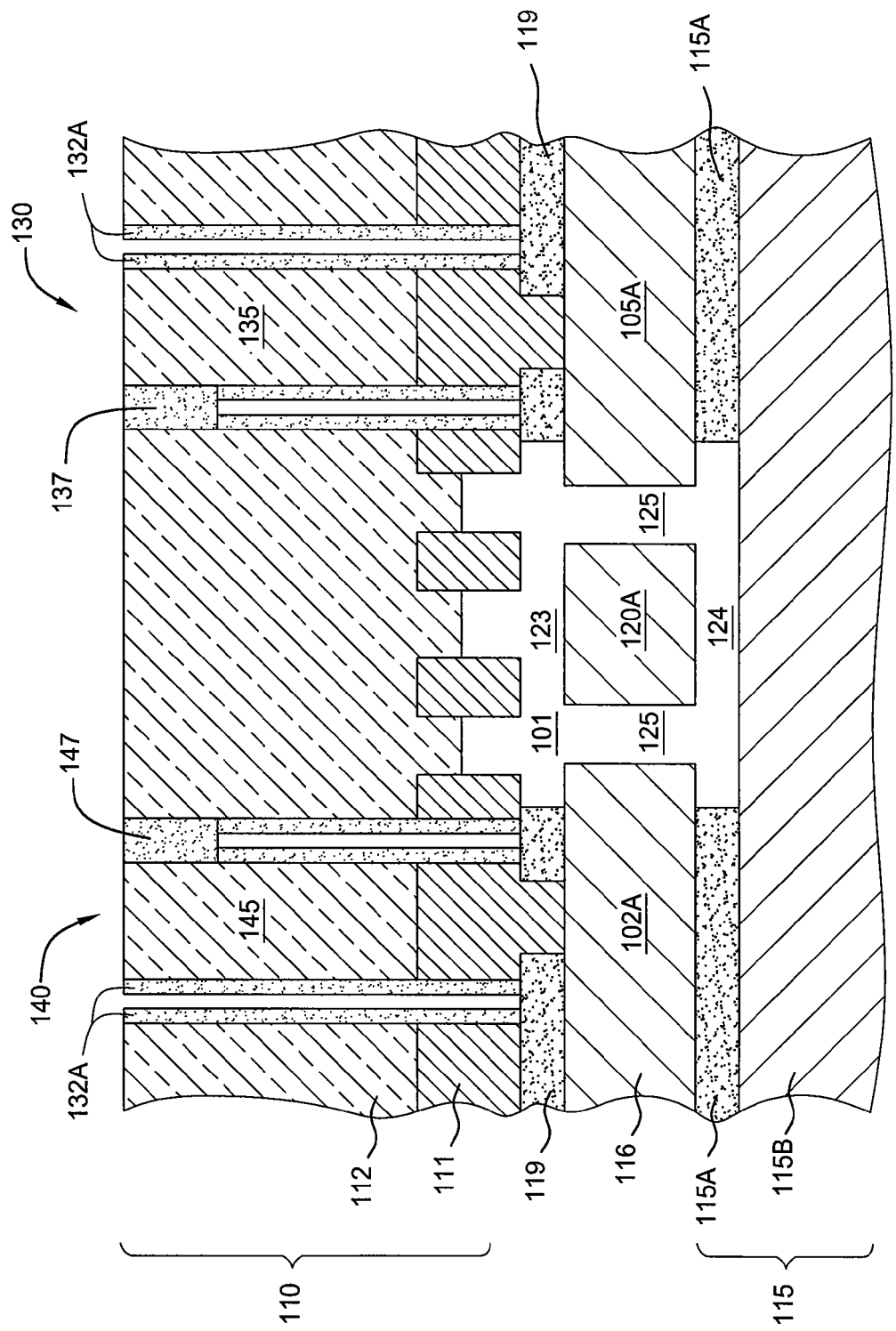

Referring to FIG. 2G, an isolation trench liner 132A is then formed on all exposed surfaces of isolation trenches 132 by exposing isolation trenches 132 to a thermal oxidation process. During this process, ground straps 118, 128 are also oxidized to transform conductive ground straps into nonconductive, oxidized materials, i.e., oxidized ground strap 137, 147. Oxidized ground straps 137, 147 and isolation trench liner 132A are illustrated in FIG. 2G. In FIG. 2G, oxidized ground straps 137, 147 correspond to the configuration of ground straps 118, 128 described above in conjunction with FIG. 3C. Isolation liner 132A is an oxide layer that acts as additional electrical isolation between bulk contact regions 135, 145 and other regions of encapsulation layer 110. Oxidized ground strap 137 completes the electrical isolation of bulk regions 135, 145 from encapsulation layer 110 and other conductive structures of MEMS resonator 100.

Oxidation processes commonly known in the art may be used. In one example, a diffusion furnace is used to perform the oxidation process. During such a process, oxygen diffuses into the surface region of a silicon substrate, creating an electrically isolating oxide layer that is between about 500 Å and 2000 Å thick. As the oxidation rate slows dramatically after about 1000 Å, isolation trench liner 132A is generally no more than about 1000 Å thick. Similarly, ground straps 118, 128 are more likely to be completely oxidized when thickness 118T (shown in FIG. 3A) of ground strap layer 118 is less than about 2000 Å thick.

Because the oxidation of ground straps 118, 128 may be completed using the same oxidation process as the formation of isolation trench liner 132A, oxidized ground straps 137, 147 and isolation trench liner 132A may be formed simultaneously. Hence, no additional process steps are required in the fabrication of MEMS resonator 100 in order to transform ground straps 118, 128 into oxidized ground straps 137, 147.

Figure 2H:
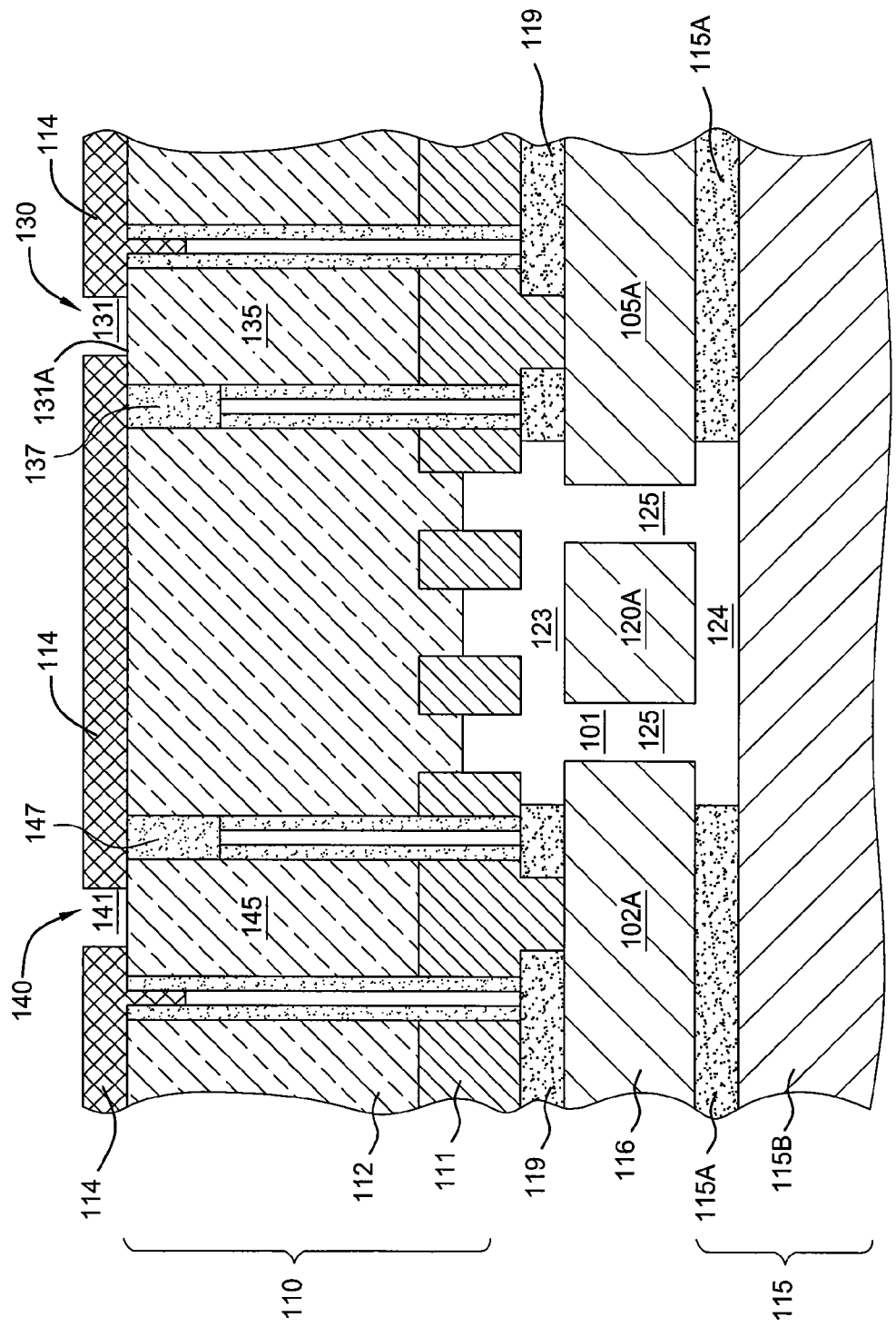

After isolation trench liner 132A is formed, a contact oxide layer 114 is formed on contact structures 130, 140 and encapsulation layer 110, then patterned and etched as illustrated in FIG. 2H. Contact oxide layer 114 is a final, electrically insulating layer configured to electrically isolate the different conductive structures of MEMS resonator 100 from each other along with providing an insulating substrate for subsequent metallization. Contact oxide layer 114 may be a conventional silicon dioxide ($SiO_2$) layer. Apertures are formed in contact oxide layer 114 so that a metallization or other conductive layer may be deposited onto an exposed surface of contact structures that are present beneath contact oxide layer 114. For example, aperture 131, which is formed in contact oxide layer 114, allows a conductive lead to be deposited in electrical communication with contact structure 130 at exposed surface 131A, thereby electrically coupling drive electrode 105A to a desired voltage source (not shown) external to MEMS resonator 100. Contact oxide layer 114 may be deposited by a PECVD TEOS method, a PECVD silane method, or an LPCVD method, among others. As shown in FIG. 2H, contact oxide layer 114 may partially fill isolation trenches 132.

As depicted in FIG. 2H, contact structure 130 includes bulk contact region 135, aperture 131 positioned above and adjacent to bulk contact region 135, isolation trench 132, oxidized ground strap 137, and the conductive path between aperture 131 and drive electrode 105A. Contact structure 140 includes bulk contact region 145, aperture 141 positioned above and adjacent to bulk contact region 145, isolation trench 132, oxidized ground strap 147, and the conductive path between aperture 141 and sense electrode 102A.

Figure 4:
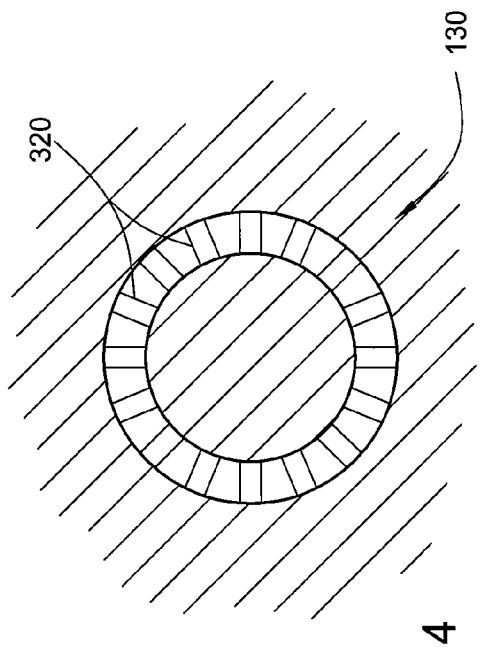
FIG. 4 illustrates a ground strap according to another embodiment of the invention.

In the embodiments of the invention described above, the ground strap bridges only a portion of isolation trench 132. Other configurations of ground strap may be used in conjunction with the present invention. FIG. 4 represents one alternative configuration. In FIG. 4, multiple ground straps 320 form conductive paths between bulk contact region 135 and surrounding regions of encapsulation layer 110.

Figure 5A:
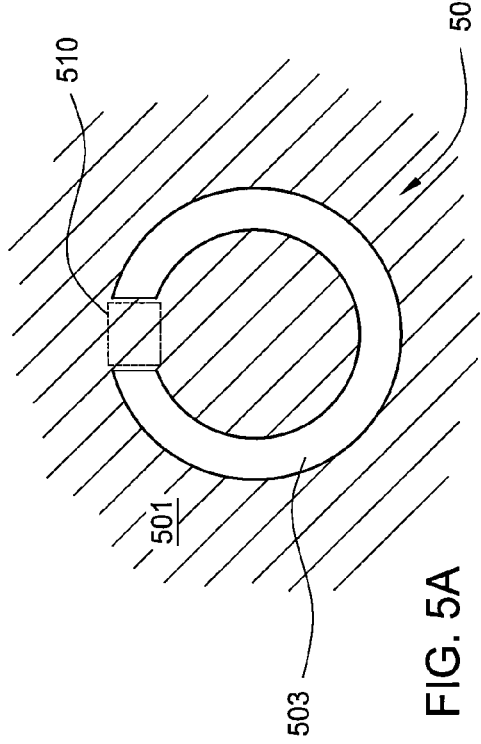
FIGS. 5A and 5B illustrate a portion of an etch mask that exposes regions of an encapsulation layer for the subsequent formation of an isolation trench.
Figure 5B:
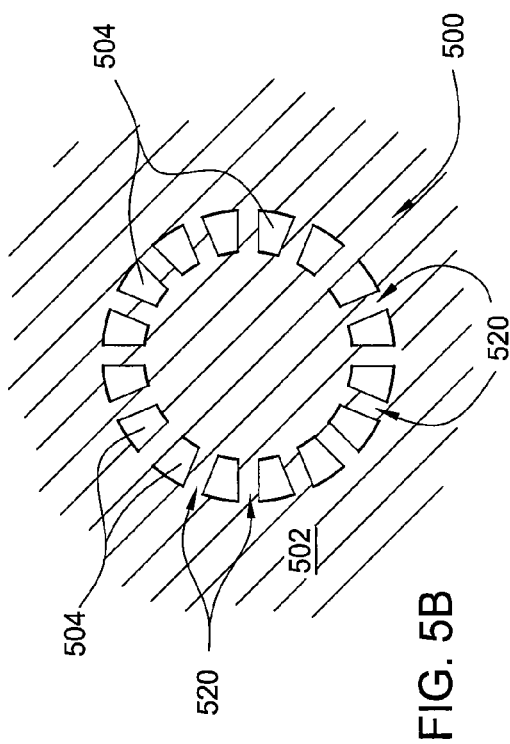

FIGS. 5A and 5B illustrate alternative embodiments of an etch mask that exposes regions of encapsulation layer 110 for the subsequent formation of an isolation trench. FIG. 5A is an embodiment of the etch mask used to form a ground strap of the type shown in FIG. 3A. FIG. 5B is an embodiment of the etch mask used to form a ground strap of the type shown in FIG. 4.

FIG. 5A is a partial plan view of an etch mask 501 positioned on a partially formed contact structure 500. Partially formed contact structure 500 substantially corresponds to contact structure 130 shown in FIG. 2F before isolation trench 132 is formed around contact structure 130. Etch mask 501 masks or covers all regions of encapsulation layer 110 around contact structure 130 during the DRIE process except for exposed region 503. Exposed region 503 partially exposes the area above isolation trench 132 for DRIE process. A bridge portion 510 of etch mask 501 covers a portion of the area above isolation trench 132 during the DRIE process. The portion of the area above isolation trench 132 that is covered by bridge portion 510 corresponds to the location of ground strap 118 shown in FIG. 3A.

Similarly, FIG. 5B is a partial plan view of an etch mask 502 positioned on partially formed contact structure 500. Partially formed contact structure 500 substantially corresponds to contact structure 130 shown in FIG. 2F before isolation trench 132 is formed around the contact structure 130. Etch mask 502 masks or covers all regions of encapsulation layer 110 around contact structure 130 during the DRIE process except for exposed regions 504. Exposed regions 504 partially expose the area above isolation trench 132 for DRIE process. Bridge portions 520 of etch mask 502 cover portions of the area above isolation trench 132 during the DRIE process. The portions of the area above isolation trench 132 that are covered by bridge portions 520 correspond to locations of multiple ground straps 320 shown in FIG. 4.

Embodiments of the invention also contemplate other conductive materials for ground strap 118 shown in FIG. 3A and ground straps 320 shown in FIG. 4. For example, ground strap 118 and ground straps 320 may be formed by the deposition of an appropriate conductive material on top of encapsulation layer 110. Any conductive material having high etch selectivity to encapsulation layer 110 may be used, such as most metals. In this way, ground strap 118 or ground straps 320 may be formed independently from the isolation trench. The conductive path formed by ground strap 118 or ground straps 320 is then selectively removed by either conversion, e.g., via an oxidation process, or removal, e.g., via an etching process.

Embodiments of the invention further contemplate the application of a ground strap for a MEMS resonator that is encapsulated by means other than one or more deposited layers, such as encapsulation layer 110. For example, if a two-wafer bonding method is used to encapsulate a resonator beam or other microelectromechanical structure, the second wafer may act as an encapsulation layer. This method still requires a contact structure to be formed through the encapsulating wafer. If such a structure is not formed prior to bonding, and instead formed after bonding using RIE or DRIE, then a potential difference may develop between different contact structures. Unless a ground strap according to embodiments of the present invention is used, this potential difference may cause stiction of the microelectromechanical structures of the MEMS resonator. In one example, ground straps 118, 128 are formed on the second, encapsulating wafer. In another example, ground straps 118, 128 are formed on the wafer containing the micromechanical structure before the encapsulating wafer is bonded thereto.

While the foregoing is directed to embodiments of the present invention, other and further embodiments of the invention may be devised without departing from the basic scope thereof, and the scope thereof is determined by the claims that follow.

What is claimed is:

1. A fabrication process for a microelectromechanical system (MEMS) comprising:
    forming a microelectromechanical structure and conductive structures around the microelectromechanical structure, including a conductive layer above the microelectromechanical structure;
    forming contact structures for the microelectromechanical structure and the conductive structures;
    forming a trench through the conductive layer around each contact structure while maintaining a conductive path so that the contact structure is electrically coupled to other contact structures through the conductive path and the conductive layer; and
    transforming the conductive path for each contact structure to be non-conductive to cause the contact structures to be electrically isolated from each other.

2. The fabrication process according to claim 1, wherein transforming the conductive path to be non-conductive comprises oxidizing the conductive path.

3. The fabrication process according to claim 2, wherein the step of forming the trench includes:
    forming an etch mask that partially covers a trench region on the conductive layer that is to be etched; and
    etching the trench region on the conductive layer using the etch mask,
    wherein a portion of the conductive layer in the trench region that was not etched comprises said conductive path.

4. The fabrication process according to claim 3, wherein said etching is performed to produce substantially parallel trench sidewalls.

5. The fabrication process according to claim 3, wherein said portion of the conductive layer in the trench regions that was not etched has substantially the same depth as said trench.

6. The fabrication process according to claim 3, wherein said etching is performed to produce non-parallel trench sidewalls.

7. The fabrication process according to claim 6, wherein said portion of the conductive layer in the trench regions that was not etched has a V-shaped cross-section and is positioned above said trench.

8. The fabrication process according to claim 3, wherein said etching comprises reactive ion etching.

9. A method for fabricating a MEMS device, comprising:
    forming first and second conductive structures and a conductive layer above the first and second conductive structures, wherein one of the conductive structures comprises a microelectromechanical structure;
    forming an etch mask above the conductive layer, the etch mask partially exposing an area above an isolation trench that is to be formed through the conductive layer around a contact structure for one of the first and second conductive structures;
    etching the isolation trench through the conductive layer using said etch mask, wherein a conductive path from the contact structure to the conductive layer remains after etching; and
    removing the conductive path.

10. The method according to claim 9, wherein the conductive layer comprises a metallic material.

11. The method according to claim 10, wherein the step of removing the conductive path includes oxidizing the metallic material.

12. The method according to claim 10, wherein the step of removing the conductive path includes etching the metallic material.

13. The method according to claim 9, wherein the step of removing includes oxidizing the conductive path.

14. The method according to claim 9, wherein said etching is performed to produce substantially parallel isolation trench sidewalls.

15. The method according to claim 14, wherein the conductive path has substantially the same depth as said isolation trench.

16. The method according to claim 9, wherein said etching is performed to produce non-parallel isolation trench sidewalls.

17. The method according to claim 16, wherein said conductive path has a V-shaped cross-section and is positioned above said isolation trench.

18. A method of manufacturing a device having an electromechanical structure and an electrode structure, comprising:
    forming an insulating layer on top of the electromechanical structure and the electrode structure;
    forming a conductive layer on top of the insulating layer;
    etching through the conductive layer using the insulating layer as the etch stop layer to partially form an isolation trench of a contact structure for one of the electromechanical structure and the electrode structure; and
    transforming one or more portions of the conductive layer that have not been etched to be non-conductive to complete the formation of the isolation trench.

19. The method according to claim 18, wherein said electromechanical structure comprises a resonator having a resonating frequency of 1 MHz or below.

20. The method according to claim 18, wherein said etching forms substantially all of the isolation trench.

21. The method according to claim 20, wherein the portions of the conductive layer that have not been etched define one or more conductive bridges that suspend above the partially formed isolation trench.

22. The method according to claim 20, wherein the portions of the conductive layer that have not been etched define one or more conductive columns that span across the partially formed isolation trench.

23. The method according to claim 18, wherein the step of transforming includes oxidizing the portions of the conductive layer that have not been etched.

* * * * *